Figure 1:
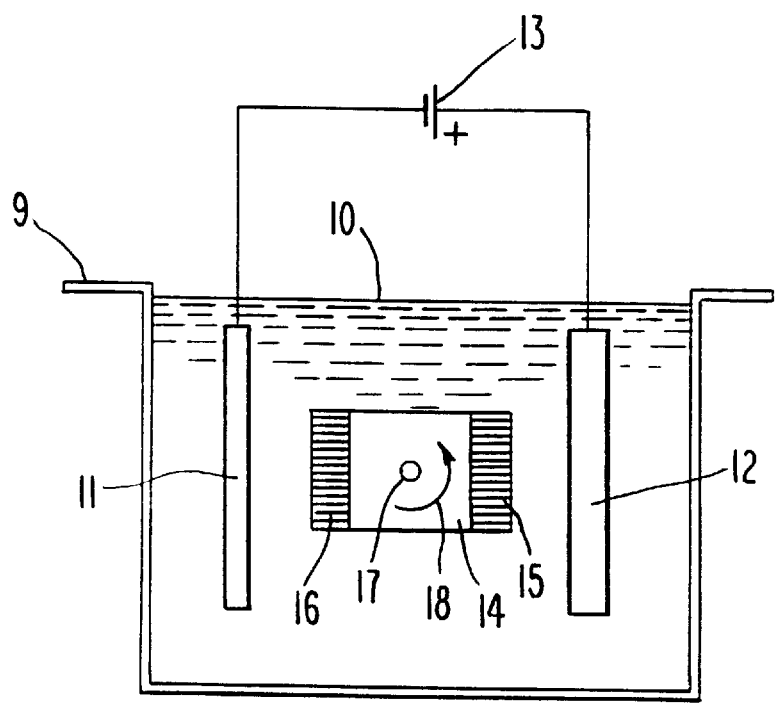

United States Patent [19]
Schneider

[11] Patent Number: 5,804,052
[45] Date of Patent: Sep. 8, 1998

[54] METHOD AND DEVICE FOR CONTINUOUS UNIFORM ELECTROLYTIC METALLIZING OR ETCHING

[75] Inventor: Reinhard Schneider, Cadolzburg, Germany

[73] Assignee: Atotech Deutschland GmbH, Berlin, Germany

[21] Appl. No.: 750,314

[22] PCT Filed: May 26, 1995

[86] PCT No.: PCT/DE95/00706

§ 371 Date: Nov. 26, 1996

§ 102(e) Date: Nov. 26, 1996

[87] PCT Pub. No.: WO95/33086

PCT Pub. Date: Dec. 7, 1995

[30] Foreign Application Priority Data

May 26, 1994 [DE] Germany .......................... 44 18 278.3

[51] Int. Cl.$^6$ .............................. C25D 5/02; C25D 5/22; C25F 7/00
[52] U.S. Cl. .................. 205/96; 204/224 R; 204/268; 204/DIG. 7; 205/97; 205/125; 205/147; 205/640; 205/652; 205/717; 205/721
[58] Field of Search ................. 205/93, 96, 97, 205/125, 147, 148, 640, 652, 654, 717–721; 204/231, 224 R, 268, DIG. 7

[56] References Cited

U.S. PATENT DOCUMENTS

| | | | |
|---|---|---|---|
| 3,619,386 | 11/1971 | Eisner | 205/87 |
| 3,699,017 | 10/1972 | Eisner | 205/73 |
| 4,043,891 | 8/1977 | Alkire | 204/231 |
| 4,776,939 | 10/1988 | Blasing et al. | 204/202 |
| 5,024,735 | 6/1991 | Kadija | 204/15 |

FOREIGN PATENT DOCUMENTS

| | | |
|---|---|---|
| 0264510 | 4/1988 | European Pat. Off. . |
| 2511336 | 3/1975 | Germany . |
| 3624481 | 7/1986 | Germany . |
| 4417550 | 5/1994 | Germany . |
| 4417551 | 5/1994 | Germany . |
| WO 9403655 | 2/1994 | WIPO . |

*Primary Examiner*—Kathryn L. Gorgos
*Assistant Examiner*—William T. Leader
*Attorney, Agent, or Firm*—Paul & Paul

[57] ABSTRACT

The invention relates to a method for continuous uniform electrolytic metallizing or etching of metal surfaces, and to a device suitable for carrying out this method. The invention is particularly suitable for treating printed circuit boards and conductive films in installations through which the metal surface being treated passes horizontally. In order to avoid metal coatings of differing thicknesses being deposited on narrow and wide conductor strips in printed circuit boards, according to the present invention operation is with movable, preferably rotating roller-shaped intermediate electrodes, which roll without short circuit at a very close effective distance above the metal surface being treated, or which contact the surface in a wiping manner. These intermediate electrodes are not electrically connected to the source of bath current, thus serving as bipolar electrodes, and are located between the surface being treated and a suitable counter-electrode.

10 Claims, 2 Drawing Sheets

METHOD AND DEVICE FOR CONTINUOUS UNIFORM ELECTROLYTIC METALLIZING OR ETCHING

DESCRIPTION

This is a national stage application of PCT/DE95/00706, filed May 26, 1995.

The invention relates to a method and a device in particular for continuous uniform electrolytic metallizing or etching of metal surfaces.

Methods of metallizing or etching, particularly for processing and manufacturing printed circuit boards, and devices suitable for this purpose have been known for a long time. For example there is described in DE 36 24 481 A1 an arrangement for electrolytic application of a metal to plate-shaped articles such as printed circuit boards, in which these articles are brought into an electrolysis bath for a certain residence time and are then removed from the bath, the articles being supplied in a horizontal position to an electrolysis chamber forming the arrangement, being passed continuously through this and after electrolytic treatment are brought out of the chamber again, and in which anodes, power supplies and transport means are provided. The transport means are further in the form of an endlessly revolving driven series of individual transport members, which securely hold the lateral edges of the plate-shaped articles and move them in the direction of travel, and in which at the beginning and end of the transport path situated in the electrolysis chamber, means are provided which cause the articles to be grasped by the transport members or released by them. Such an installation can be used with corresponding additional equipment also for electrolytic etching for example the removal of metal coatings (demetallizing).

In other arrangements, the articles to be treated are dipped in a vertical position into a treatment agent or are brought into contact therewith by spraying or injection, the counter electrodes necessary for the electrolytic treatment being located opposite the said article. For electrolytic metallization, the counter electrodes are polarised as anodes and for an etching process as cathodes.

In the known electrolytic installations in which the articles are disposed horizontally and are moved in a horizontal direction through the arrangement, the spacing between the articles and the counter electrodes comes to approximately 100 mm. In the manufacture of printed circuit boards, such large spacings have a detrimental effect on the quality of the coatings to be processed. Narrow conductor strips on the printed circuit boards act relative to adjacent wide conductor strips as peaks, on which the electrical field in the electrolytic treatment cell is concentrated. Therefore a higher localised current density forms at these points, so that these points are thus more intensively, i.e. more rapidly electrolytically etched or metallized than wide conductor strips.

As a result coating thickness ratios of 1:3 and more are encountered at the various points on the surface of a printed circuit board. During etching, the different electrical field intensities lead to an attack on the lateral flanks of a conductor strip and thus to under-etching. This is no longer tolerable in fine conductor technology, in which conductor strip widths of 0.1 mm and less are to be produced.

In order to solve this problem various measures are possible, individually or in combination. Thus for example the electrolytic treatment may be carried out at a low current density. However, in this way the efficiency of the treatment installation is reduced. Improvements are also achieved with an enlarged spacing between anode and cathode. On the other hand, the peak effect described may also be avoided in that the spacing between anode and cathode is reduced so far that the narrow conductor strips no longer act as peaks, but as surfaces. This is the case particularly when the counter-electrodes (during etching the cathodes, and during metallizing the anodes) are brought closer to the articles for treatment to a spacing of 1 mm or less. In this case the maximum usable current density is limited only by the required quality of the metal coatings to be processed or produced and the thickness-specific surfaces of the diffusion layer, which in turn is influenced by the intensity of the convection of the electrolyte at the treatment point. The maximum current density lies considerably above the current density which is usable in conductor strips which act as peaks. Thus an electrolytic treatment with extremely small spacings between anode and cathode is preferred.

Such devices, which are used for example for treating strip-like carrier materials or metal strips, are described in DE-OS 25 11 336 and EP 0 264 510 A1.

Small spaces between the anodes and cathodes may be produced in particular with roller-shaped electrodes which roll along the surface of the material for treatment. Such an arrangement is described in WO 94/03655, whose disclosed content is incorporated in this Application.

In order to avoid electrical short circuits, in this case an insulating spacer means is provided between the roller-shaped electrodes and the article to be treated. Suitable for this are for example partial coatings of the rollers, which are so constructed that current permeability is extensively maintained by the film of fluid lying between the rollers and the material for treatment. It is also possible to use the resist applied to the surface of the printed circuit boards, said resist representing the conductor image as positive or negative, as spacing means. This latter is electrically insulating and its coating thickness is of such a size that short circuits are reliably avoided.

Such rollers may for example be in the form of insoluble electrodes. For electrical contacting these, due to the rotation, must be electrically conductively connected via slip rings and slip brushes to the source of bath current. This slip ring technique is however technically complex. Such arrangements are shown in the patent applications DE-P 441 7550.7 and DE-P 44 17 551.5. In these, for example, electrically non-conductive spacer rings are used as insulating spacer means on the roller, or the insulating layer of a photoresist on the surface of the printed circuit board surface. For contacting, slip contact brushes are used, attached to slip rings on the rollers to be contacted. The disclosed content of the named DE patent applications is included in this application.

A device and method are known from U.S. Pat. No. 3,619,386 by means of which metal films can be electrolytically deposited. A non-electrically-contacted bipolar activating electrode is in the form of a belt passed around two rollers and continuously contacting the cathode surface under pressure. In this case the surface of the belt passes over an anode and a cathode, depositing on the cathode surface metal dissolved from the anode and carried along by the belt. The surface of the belt includes metal and bound up therewith electrically non-conductive particles of knoop hardness HK 10 according to ASTM. The particles have an abrasive action on the cathode surface, and are therefore unsuitable for treatment of printed circuit boards. The method is designed as a high-current process and therefore has the disadvantage already described, i.e. of forming current peaks with the conductor tracks.

In electrolytic etching according to known methods and arrangements, the slip-ring technique is also necessary in order to connect the insoluble roller-shaped electrode to the source of bath current. If the roller-shaped electrode is located between the material for treatment and an electrode lying opposite the said material, metal deposits on this electrode both in electrolytic etching and in metallization, in metallization on the side facing away from the material for treatment, and in etching on the side of the roller facing the said material. Therefore the metal has to be removed from this electrode, continuously or chronologically repeated treatment cycles. For continuous removal a second source of bath current is suitable, which is positively polarised relative to the electrode during metallisation, and during etching.

During etching, the positive pole of the source of current is electrically connected in a way known per se with the material for treatment, for example via electrically contacting clamps. The negative pole is connected to the electrode via a slip contact and a slip ring. The etched-off metal is deposited on the said electrode. A second electrolytic cell is formed by a further source of bath current, the electrode and a further auxiliary electrode, the second cell being disposed on the side of the electrode facing away from the material for treatment. The positive pole of the second source of bath current is connected via the same slip contact and slip ring with the electrode as the negative pole of the first source of bath current and its negative pole with the electrode lying opposite the material for treatment. The metal is deposited on this latter, said metal being again dissolved from the electrode again after the material for treatment has been etched.

Should metal deposited on the electrode during metallization not be entirely removed again, this can be etched off, the polarity of the sources of bath current being intermittently changed in a way known per se, and plates having insoluble metal surfaces being also treated in the installation. In this case the metal dissolves again from the electrodes and deposits on the counter-electrodes, which in this case are incorporated cathodically, so that no further metal is deposited on the electrodes.

In such methods, the electrode must be electrically contacted via slip contacts. This is constructively complex and requires intensive servicing. Furthermore, an additional source of bath current is required. Again, the treatment method for removing the metal deposited on the electrodes must be interrupted from time to time.

Instead of an insoluble counter-electrode, basically soluble or at least partly soluble counter-electrodes may also be used. In this case however, suitable measures must be taken in order to keep constant the metal ion concentration in the electrolyte fluid. In the case of metallization of the material for treatment, for this purpose for example salts of the metal to be separated are added. During etching, these must be removed again from the electrolyte by suitable methods. A continuous supplementation of the metal salts results in a continuous consumption of metal salts, decomposition products thereby being continuously enriched in the electrolyte, and requiring to be removed in a complex manner from the electrolyte and disposed of. The use of cost-effective soluble electrodes is not possible, because these, due to their dissolution, are not dimensionally stable, and therefore do not permit a constant small effective distance between anode and cathode.

In view of this, the problem underlying the present invention is to find a method of continuous uniform electrolytic metallization of etching (demetallising) of metal surfaces, particularly also of printed circuit boards, and a device suitable for carrying out such a method. In particular, disadvantages of the known methods and arrangements are to be avoided, while still utilising their advantages.

This problem is solved by the method and apparatus of the invention. Advantageous embodiments of the invention are indicated in the sub-claims. The term metal surfaces is understood to mean also surfaces of non-metallic materials, which are at least partly coated with metal.

In the method according to the invention in particular, small effective distances are made possible between the anodes and cathodes, so that extremely uniform metal coatings can be obtained on printed circuit boards with narrow and wide conductive tracks. Soluble anodes are used as counter-electrodes for continuous metallization. Supplementation of the metal ions by addition of metal salts to the electrolytic fluid is not necessary. In electrolytic etching the metallization for example is not interrupted during the manufacture of printed circuit boards by cyclical demetallization procedures on the electrodes. In addition the arrangement according to the invention is simple in construction and requires no complex outlay on servicing, as there is no necessity to use a complicated slip contact technique for rotating roller electrodes. In the device according to the invention electrodes formed from the metallic surfaces of the material for treatment and counter-electrodes lying opposite to these, are located in an electrolytic cell.

Plates in particular can be used as counter-electrodes. The source of bath current is connected to these electrodes. Between the material for treatment and the counter-electrodes there are located movable, for example rotating roller-shaped electrodes, which are not connected to the source of bath current. The spacing between the material for treatment and the counter-electrodes is extensively bridged over by these intermediate electrodes. The intermediate electrodes are electrically conductive. They are however mounted in an electrically insulated manner and for example move in a rolling fashion at a very small distance from the surfaces of the material for treatment. In one embodiment of the invention the intermediate electrodes can also contact the surfaces of the material for treatment in a wiping manner, their speed of movement or rotation being adjusted relative to the surface of the material for treatment in an appropriate way.

In order to avoid direct metallic contact between the material for treatment and the metallic surface of the intermediate electrodes, there are located therebetween electrically insulating spacer means, which are permeable to liquid and ions, for example ceramic particles or partial plastics coatings, textile structures or plastics rings or other profiled material, on the outer side of the intermediate electrode. Their shape and arrangement are so selected that the electrical field lines can pass substantially unhindered through the thin film of liquid located between the intermediate electrodes and the material for treatment. The electrical screening effect of these spacer means is small. For example, screening effects of the individual spacer means can be compensated for if the spacer means are located on rollers disposed along the direction of transport in the treatment installation, and offset to one another. The intermediate electrode is preferably constructed from an insoluble material, for example of stainless steel or titanium with or without a coating of noble metals or their oxides.

The spacing between the intermediate electrodes and the counter-electrode is of such dimensions that here also any contact is reliably avoided.

Such intermediate electrodes disposed in an insulated manner between the material for treatment and the electrodes are metallized on the side facing the anode, and demetallized, i.e. etched, on the side facing the cathode. During metallization of the material for treatment, therefore, metal is deposited on the side of the intermediate electrode facing away from the material for treatment, and during etching on the side facing the material for treatment.

Figure 2:
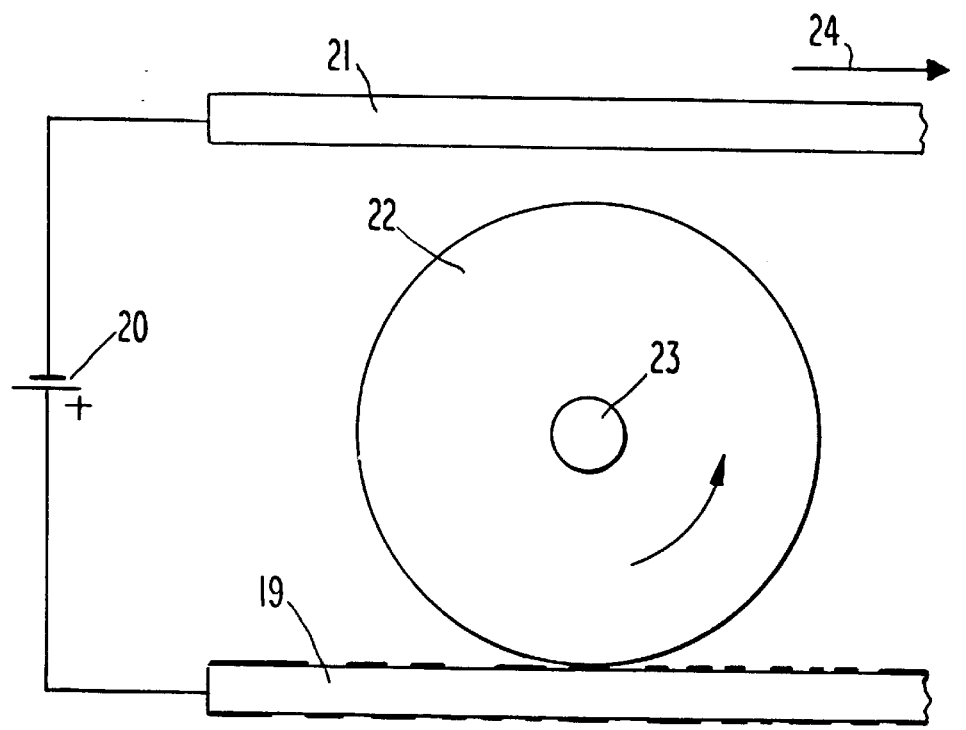
Figure 3:
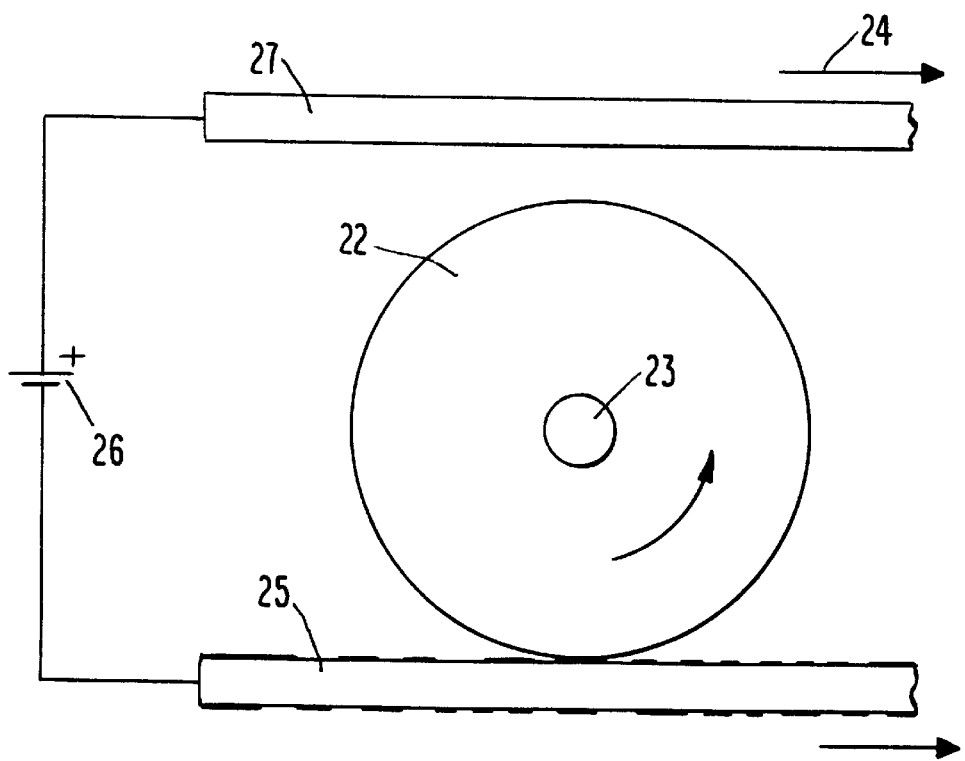

By means of suitable construction, the intermediate electrodes can also serve to transport treatment fluid on to the surface of the material for treatment. For this purpose the intermediate electrodes may for example consist of an open-work inner tube and a metal mesh surrounding this latter, for uniform distribution of the emerging treatment medium. Suitable embodiments for such roller-shaped electrodes are described in WO 94/03655 and in the International Patent application PCT/DE95/00134. The present invention will be illustrated and described in theory and by way of example with reference to the diagrammatic figures, but without restricting the invention thereto. Shown are:

FIG. 1, a device not according to the invention, showing only the theoretical effect;

FIG. 2, a theoretical view of an etching process according to the invention;

FIG. 3, a theoretical view of the metallization process according to the invention.

For reasons of simplicity of drawing, the devices are not shown true to scale.

According to FIG. 1 there are located in a bath container 9 with electrolyte liquid 10 a cathode 11 and anode 12. A source of bath current 13 is electrically connected to the anode and to the cathode. If an electrical conductor, in this case a part provided with a metallic surface or a metal part 14, which has no contact with the anode or the cathode, is introduced into the anode/cathode path when the source of bath current is switched on, then in the area 15 of the part metal is deposited, which has dissolved from the anode due to the electrolysis procedure. If the metal part 14 itself is soluble, metal is electrolytically removed from the area 16 of the part and deposited on the cathode 11. If on the other hand the metal part in the electrolyte fluid is insoluble, then gas is generated at the area 16 facing the cathode.

The reference numeral 17 represents an axis about which the metal part can be rotated. After a rotation of 180° of the metal part in the direction of arrow 88, the metal deposited in area 15 is now opposite the cathode. Here it is etched off again and finally deposited on the cathode. At the same time metal etched off is now separated from the anode in the area 16. This procedure is repeated, with corresponding relative movement to the electrodes, for example with continuous rotation of the metal part.

The flow of electrolyte through the non-electrically contacted metal part comes about due to the very varying electrical conductivities of the electrolyte fluid and of the metal part. The metal part serves as a metal conductor between the electrodes, the cathode 11 and the anode 12. This intermediate member thus involves an intermediate bipolar electrode. In a preferred embodiment the immediate electrode is in the form of an elongate roller, which rolls at a very close spacing to the surface of the material for treatment. For example such a roller or an equivalent movable member can be passed along the surface of a planar article submerged in a vertical position in the treatment fluid.

The method according to the invention is particularly suitable for treating printed circuit boards which are passed in a horizontal position and in a horizontal direction through a treatment installation. Such an arrangement of the electrodes and of the source of bath current is shown in FIG. 2 for an etching process.

The material for treatment 19 to be etched is connected via electrically contacting clamps not shown to the positive pole of the source of bath current 20. The other pole of the source of bath current is connected to a cathode 21. A roller 22 longitudinally extended to the plane of the drawing as an intermediate electrode is highly electrically conductive at least on its surface. It is mounted to be vertically adjustable with its bearing pins 23, so that different thicknesses of printed circuit boards are automatically compensated for. A very small spacing between the surface of the material for treatment and the roller-shaped intermediate electrode is enabled and kept constant by insulating and preferably extremely thin spacer means, which are not shown here. The roller rotates at a speed of rotation which preferably corresponds to the transport speed of the material for treatment in a horizontal direction. If differing speeds are selected, the surface of the intermediate electrode wipes along the surface of the material for treatment.

The spacing between the counter-electrode 21 polarised as a cathode and the roller is not critical as regards the quality of electrolytic processing of the material for treatment. By means of sporadic offsetting of the cathode in the direction of arrow 24, the point at which the largest quantity of metal etched off the material for treatment deposits and is located in the effective area of the roller, can be displaced laterally, so that a new surface area of the cathode, upon which no metal or only a small amount of metal has as yet deposited, is moved into the named area. In this way the available cathode surface for depositing of etched off metal is totally usable.

An advantage in this respect is that, in the etching process described, a recovery of metal takes place. Additional chemical recovery methods are therefore not necessary. During electrolytic etching the metal passes from the material for treatment firstly on to the roller and then on to the cathode. For this purpose according to the invention only one source of bath current is necessary. Furthermore, no electrical contacting of the roller is necessary. In an etching installation, a plurality of rollers are preferably disposed in the transport direction of the material for treatment in succession. Similarly, these may also be located for two-sided and/or synchronous treatment of the printed circuit boards, on the underside of the same.

FIG. 3 shows a theoretical view for metallization of printed circuit boards 25 in a horizontal position. The source of bath current 26 is connected to the positive pole at the counter-electrode (anode) 27 lying opposite the material for treatment 25, the negative pole to the material for treatment 25. The rotating roller 22, as already described with reference to FIG. 2, is in the form of an intermediate electrode. The anode 27 may be in the form either of an insoluble or as a soluble electrode. In both cases an extremely small constant spacing is set between the material for treatment and the intermediate electrode. Independently of this, the path between the anode and the roller is not critical for the quality of the deposited metal coating on the material for treatment. This permits the use of cost-effective soluble anodes, whose geometry due to the permanent dissolution cannot be kept constant, and therefore would be unsuitable for direct use without the intermediate electrode according to the invention and with a very small spacing between anode and cathode.

By means of sporadic offsetting of the soluble anodes in the transport direction 24, in this case also all areas of the anode in succession are used for metallizing. The area on the anode lying opposite the upper contour line of the roller is continuously most intensely etched. By means of offsetting in direction 24, areas of the anode from which no metal or only a little metal has yet been etched, is brought into a position lying opposite the named contour line of the roller. For electrolytic metallization of both sides of the printed circuit boards, corresponding devices with roller-shaped intermediate electrodes are also located on their undersides.

The invention is not restricted to the use of roller-shaped intermediate electrodes, but also includes such electrodes of a different shape with an if necessary relative movement equivalent to rotation to the other elements of the cell which are available for interaction.

I claim:

1. Method of uniform electrolytic metallizing, etching or demetallizing of a metal surface, comprising
    bringing the metal surface and at least one electrode lying opposite it into contact with an electrolyte;
    applying an electrical voltage between the metal surface and the electrode;
    positioning between the electrode and the metal surface at least one electrically unconnected insoluble intermediate member comprising a roller with an electrically conductive material on at least a part of its outer surface, and rolling each intermediate member along the metal surface, each intermediate member acting as a bipolar electrode;
    wherein at least one electrically insulating member is interposed between each intermediate member and the metal surface to form a gap between each intermediate member and the metal surface.

2. Method according to claim 1, wherein said roller has a longitudinal axis and rotates about said longitudinal axis.

3. Method according to any one of claims 1 or 2, wherein the metal surface is metallized and metal ions required for metallization are supplied to the electrolyte by electrolytic dissolution of said electrode or by the addition of metal salts.

4. Method according to any one of claims 1 or 2, wherein the metal surface is moved continuously or intermittently relative to each intermediate member.

5. Method according to any one of claims 1 or 2, wherein continuous uniform metallizing or etching of printed circuit boards is carried out, and wherein said circuit boards are guided by transport means in a horizontal position and in a horizontal direction.

6. Device for continuous uniform electrolytic metallizing, etching or demetallizing of a metal surface, comprising:
    an electrolysis cell,
    at least one electrode and means to position the metal surface opposite the electrode,
    an electrolyte in the electrolysis cell adapted to contact the metal surface and the electrode,
    a source of voltage and means to connect the source of voltage with the metal surface and the electrode,
    at least one electrically unconnected insoluble movable intermediate member comprising a roller with an electrically conductive material on at least on part of its outer surface disposed between the metal surface and the electrode and adapted to serve as a bipolar electrode,
    means for rolling each intermediate member along the metal surface, and
    at least one electrically insulating member interposed between each intermediate member and the metal surface to form a gap between each intermediate member and the metal surface.

7. Device according to claim 6, wherein at least one electrically insulating member is provided on the outer surface of each intermediate member.

8. Device according to any one of claims 6 or 7, wherein at least one electrode is in the form of a plate.

9. Device for metallizing according to any one of claim 6 or 7, wherein at least one electrode comprises material to be deposited.

10. Device according to any one of claims 6 or 7, wherein said device further comprising transport means for guiding the metal surface in a horizontal direction and maintaining it in a horizontal position.

* * * * *